(12) United States Patent
Vecino Vazquez et al.

(10) Patent No.: US 9,929,727 B2
(45) Date of Patent: Mar. 27, 2018

(54) SYSTEM AND METHOD FOR A SWITCHING TRANSISTOR

(71) Applicant: Infineon Technologies Austria AG, Villach (AT)

(72) Inventors: Enrique Vecino Vazquez, Munich (DE); Katarzyna Kowalik Seidl, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/190,874

(22) Filed: Jun. 23, 2016

(65) Prior Publication Data

US 2017/0019096 A1  Jan. 19, 2017

Related U.S. Application Data

(60) Provisional application No. 62/191,779, filed on Jul. 13, 2015.

(51) Int. Cl.
| | |
|---|---|
| *H03K 17/60* | (2006.01) |
| *H03K 17/06* | (2006.01) |
| *H02M 1/08* | (2006.01) |
| *H02M 1/00* | (2006.01) |

(52) U.S. Cl.
CPC ............ *H03K 17/063* (2013.01); *H02M 1/08* (2013.01); *H02M 2001/0054* (2013.01); *H03K 2217/0036* (2013.01); *Y02B 70/1491* (2013.01)

(58) Field of Classification Search
CPC ............... H03K 17/06; H03K 17/063; H03K 2217/0036; H02M 1/08; H02M 1/081; H02M 1/082; H02M 1/083; H02M 1/10; H02M 2001/0048; H02M 2001/0051; H02M 2001/0054; H02M 2001/0058; Y02B 70/00; Y02B 70/10; Y02B 70/14; Y02B 70/1491
USPC ................................. 327/419, 427, 430–434
See application file for complete search history.

(56) References Cited

U.S. PATENT DOCUMENTS

| | | | |
|---|---|---|---|
| 9,337,716 B2 * | 5/2016 | Liao | H02M 1/126 |
| 2004/0085117 A1 * | 5/2004 | Melbert | H03K 17/168 327/432 |

* cited by examiner

*Primary Examiner* — Lincoln Donovan
*Assistant Examiner* — Diana J Cheng
(74) *Attorney, Agent, or Firm* — Slater Matsil, LLP

(57) ABSTRACT

In accordance with an embodiment, a method of operating a semiconductor switch coupled to an inductor includes turning on the semiconductor switch by applying a turn-on voltage to between a gate of the semiconductor switch and a low current terminal connected to a reference node of the semiconductor switch, the low current terminal separate from a high current reference terminal connected to the reference node of the semiconductor switch, and the semiconductor switch comprises a first input capacitance to transconductance ratio. The method further includes turning off the semiconductor switch by applying a turn-off voltage to the gate of the semiconductor switch, wherein a ratio of a total capacitance at an output node of the semiconductor switch to a gate-drain capacitance is greater than a first ratio per watt of power being handled by a load coupled to the semiconductor switch.

27 Claims, 7 Drawing Sheets

SYSTEM AND METHOD FOR A SWITCHING TRANSISTOR

This application claims the benefit of U.S. Provisional Application No. 62/191,779, filed on Jul. 13, 2015, which application is hereby incorporated herein by reference in its entirety.

TECHNICAL FIELD

The present disclosure relates generally to an electronic device, and more particularly to a system and method for a switching transistor.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation across resistive voltage drops.

A SMPS usually includes at least one switch and an inductor or transformer. Some specific topologies include buck converters, boost converters, and flyback converters, among others. A control circuit is commonly used to open and close the switch to charge and discharge the inductor. In some applications, the current supplied to the load and/or the voltage supplied to the load is controlled via a feedback loop.

One of the factors that determine the efficiency of a SMPS is the amount of power consumed by the switching transistor that is used to implement the switch in the SMPS. As the switching transistor is turned on, any current that flows through the switching transistor is dissipated through the switching transistors. Thus, the higher the voltage across the switching transistor when the transistor is conducting current, the higher the power dissipated through the switching transistor.

SUMMARY OF THE INVENTION

In accordance with an embodiment, a method of operating a semiconductor switch coupled to an inductor includes turning on the semiconductor switch by applying a turn-on voltage to between a gate of the semiconductor switch and a low current terminal connected to a reference node of the semiconductor switch, the low current terminal separate from a high current reference terminal connected to the reference node of the semiconductor switch, and the semiconductor switch comprises a first input capacitance to transconductance ratio. The method further includes turning off the semiconductor switch by applying a turn-off voltage to the gate of the semiconductor switch, wherein a ratio of a total capacitance at an output node of the semiconductor switch to a gate-drain capacitance is greater than a first ratio per watt of power being handled by a load coupled to the semiconductor switch.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for an inductively switching transistor that operates in the hard switching regime. Embodiments of the present invention may be applied to various systems that utilize switching transistors including, but not limited to switched-mode power supplies and motor control systems.

In an embodiment, the parameters of a gate driving circuit and an inductively loaded switching transistor are adjusted such that when the transistor is turned-on during a hard switching condition, the voltage across the transistor is significantly reduced prior to the current increasing though the transistor, thereby reducing the power dissipated across the transistor. In some embodiments, these conditions are met when the switching transistor is disposed in a package having separate sense terminal and a load path terminal connected to a reference node of the switching transistor, the switching transistor an input capacitance to transconductance ratio of less than 75 pF $V^2$/A, and a ratio of the sum of the output capacitance at the output node of the semiconductor switch to the gate-drain capacitance of the switch is greater than 0.006 per watt of power being handled by a load coupled to the switching transistor. In some embodiments, the effective capacitance of the freewheeling loop is dominated by the freewheeling diode.

Figure 1A:
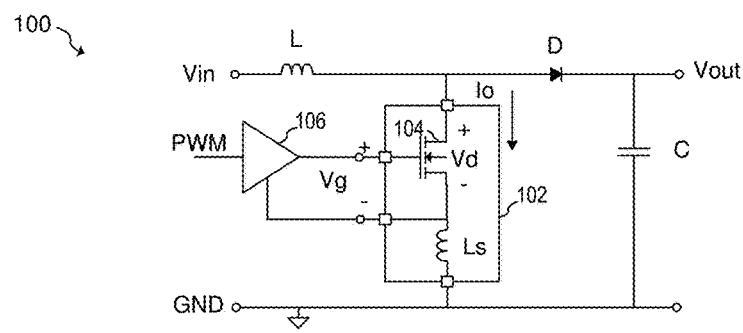
FIG. 1a illustrates a schematic example of an embodiment switching system.

FIG. 1a illustrates an embodiment switched-mode power supply system 100 that includes switching transistor 104 being driven by transistor driver 106. As shown, the switching transistor 104 is implemented as a MOSFET disposed on die 102. Alternatively, other transistor types, such as an IGBT may be used. During operation, switching transistor is turned on by driver 106 and magnetizes inductor L by causing drain current Io to flow from Vin to GND. When switching transistor 104 is turned off by driver 106, current through inductor L is redirected through diode D and charges capacitor C to provide power to any load that is coupled to output node Vout. In some embodiments, a controller (not shown) may be provided to modulate the pulse width of signal PWM coupled to the input of driver 106 in order to regulate the voltage at output node Vout and/or currents within switched mode power supply system based on voltage and/or current feedback.

In one mode of operation, transistor 104 may be turned on when the voltage Vd is greater than zero. Such a mode of operation is referred to as a "hard switched" mode of operation. In hard switching applications under typical conditions, switching transients at turn-on and turn-off of switching transistor 104 may include high currents when the voltage Vd is still high, thereby causing switching losses that reduce the efficiency of power supply system 100. It should be understood that the schematic of FIG. 1a is just one example of many possible topologies for use with embodiments described herein.

Figure 1B:
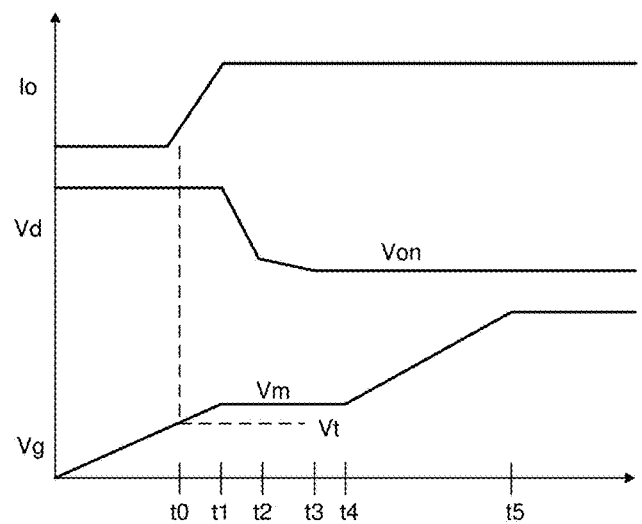
FIGS. 1b and 1c illustrate waveform diagrams of switching systems.

FIG. 1b illustrates a waveform diagram of the drain current Io, drain-source voltage Vd and gate voltage Vg of switching transistor 104 during turn-on. As shown, drain current Io is zero until gate voltage Vg reaches threshold voltage Vt at time t0, at which time current Io begins to increase and power begins to be dissipated across switching transistor 104 according to the relationship Io*Vd. At time t1, the Miller plateau region is reached in which the gate voltage becomes substantially constant over time because the gate-drain capacitance is being discharged. Also, at time t1, the drain current Io becomes constant and the drain voltage Vd begins to decrease. At time t2, the slope of Vd decreases due to the increase of the parasitic capacitances of the switch at lower drain-source voltages until it approaches the final value of Von at time t3. In many cases, these parasitic capacitances are a non-constant function of drain voltage Vd. At time t4, the system exits Miller plateau region, thereby allowing the gate voltage Vg increase until it reaches its final value at time t5.

Figure 1C:
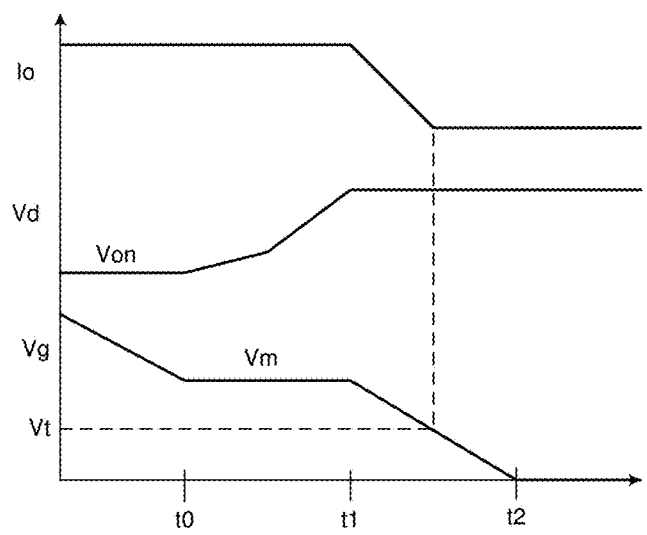

FIG. 1c illustrates a waveform diagram of the drain current Io, drain-source voltage Vd and gate voltage Vg of switching transistor 104 during turn-off. As shown, gate voltage Vg decreases until the Miller plateau is reached at time t0 at which time the drain voltage begins to increases. At time t1, the drain voltage has reaches its final value and the gate voltage Vg begins to decrease again because the gate-drain capacitor of the switching transistor has been discharged. Also at time t1, the drain current Io begins to decrease until it reaches zero when gate voltage Vg reaches the threshold voltage Vt of the transistor. Then, the gate source capacitance continues to discharge until gate voltage Vg reaches zero volts at time t2. Power is dissipated through the switching transistor from time t0 to the time in which the threshold voltage Vt is reached when both the drain current Io and the drain voltage Vd are non-zero. The peak power is reached at time t1 when both drain current Io and drain voltage Vd is at a maximum.

Figure 1D:
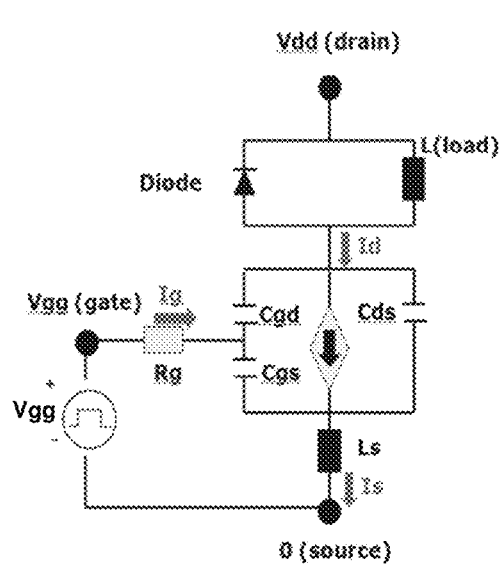
FIGS. 1d and 1e illustrate example switching system schematics.
Figure 1E:
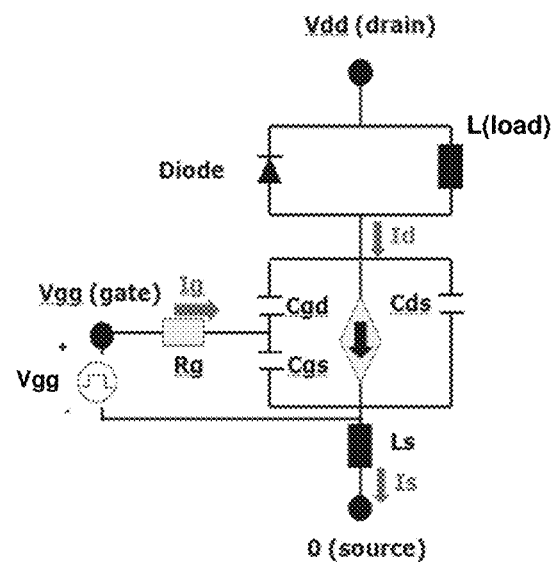

FIGS. 1d and 1e show illustrative schematics for switching transistor systems used for the purpose of analysis herein. FIG. 1d illustrates a classic configuration for a MOSFET switching transistor in which the MOSFET is modeled as a voltage controlled current source, gate resistor Rg and parasitic gate-source capacitance Cgs, parasitic gate-drain capacitance Cgd and parasitic drain-source capacitance. In some embodiments, Rg is the sum of the external gate resistance of the driver loop and the internal gate resistance of the switch. The package inductance at the source of the switching transistor is model as inductor Ls, the load inductance is modeled as inductor L, and a freewheeling diode is represented as a diode. The gate voltage is defined as Vgg, the drain voltage is defined at Vdd, and the source is assumed to be grounded.

FIG. 1e illustrates an embodiment switching transistor configuration having a dedicated source pin for a gate driver (not shown) in a Kelvin source configuration. In some embodiments, a package having at least four pins may be used in order to have a dedicated pin for the gate driver reference terminal. As can be seen in FIG. 1e, the main difference with respect to the configuration of FIG. 1d is that the source inductance is now outside the driver loop, thus avoiding a negative voltage feedback in case of significant current changes across the source inductance. The following analysis is directed toward a hard-switching configuration such as a boost converter having a Kelvin source such as depicted in FIG. 1d. It should be appreciated FIG. 1d is just one example of many possible embodiment switching transistor scenarios. Embodiment concepts disclosed herein may be applicable to other circuit topologies that utilize switching transistors.

Equations describing the dynamics of the circuit of FIG. 1e are as follows:

$$Id = Coss\frac{dVds}{dt} - Cgd\frac{dVgs}{dt} + k(Vgs - Vth)^2,$$

$$Ig = Ciss\frac{dVgs}{dt} - Cgd\frac{dVds}{dt},$$

$$Vgg = Vgs + IgRg, \text{ and}$$

$$Vdd = Vds + Ls\frac{dId}{dt},$$

where Rg is the total gate resistance, Ls is the stray inductance of the drain loop, Vth is the threshold voltage of the MOSFET switching transistor, k is the gain of the MOSFET switching transistor, Coss (=Cds+Cgd) is the output capacitance of the MOSFET switching transistor, Ciss (=Cgs+Cgd) is the input capacitance of the MOSFET switching transistor and Cgd is the gate-drain capacitance of the MOSFET switching transistor.

These coupled differential equations may be simplified taking into account the typical values of the internal capacitances of the device. For example, for superjunction MOSFETs, Ciss is approximately three orders of magnitude larger than Cgd and Coss is approximately one order of magnitude larger than Cgd. In typical embodiment applications, dVds is between about 300 V and about 400 V, and dVgs is between about 10 V and about 15V. In some embodiments, dVds and dVgs may be outside of these ranges. Accordingly, in some embodiment applications, the following simplifying assumption can be made:

$Coss\, dVds >> Cgd\, dVgs$, and $Ciss\, dVgs >> Cgd\, dVds$.

The resulting simplified differential equations are:

$$Id = Coss\frac{dVds}{dt} + k(Vgs - Vth)^2,$$

$$Ig = Ciss\frac{dVgs}{dt},$$

$$Vgg = Vgs + IgRg, \text{ and}$$

$$Vdd = Vds + Ls\frac{dId}{dt}.$$

This system can be solved analytically yielding following expression for the drain-source voltage:

$Vds(t) = Vdd + W[F_{,osc}(t) - F_{,dec}(t)]$, where, $$W = \frac{2kLs}{RgCiss}(Vgg - Vth)^2,$$

$$Fdec(t) = \frac{e^{\frac{-t}{RgCiss}}}{1+\varepsilon_{coss}} - \frac{e^{\frac{-2\cdot t}{RgCiss}}}{1+4\cdot\varepsilon_{coss}},$$

$$Fosc(t) = \frac{\varepsilon_{coss}}{(1+\varepsilon_{coss})(1+4\cdot\varepsilon_{coss})}\cos\left(\frac{t}{\sqrt{LsCoss}}\right), \text{ and}$$

$$\varepsilon_{coss} = \frac{LsCoss}{(RgCiss)^2},$$

Where W is a weighting factor. The above expression for Vds(t) may be further simplified since, for typical values, $\epsilon_{coss} << 1$ (e.g. 10 nH*14 pF/(10 ohm*1 nF)$^2$=1.4E-6) which neglects the oscillating term of the function (Fosc) leaving a pure decaying expression for the drain source voltage:

$$Vds(t) = Vdd - W\left[e^{\frac{-t}{RgCiss}} - e^{\frac{-2\cdot t}{RgCiss}}\right],$$

This simplified expression for Vds(t) may be interpreted as follows. Unlike the case of an ideal circuit with no stray inductances, the drain source voltage (Vds) of the MOSFET gets reduced during the ramp-up phase of the current due to the presence of the stray inductance (Ls) because a portion of the overall applied drain voltage (Vdd) appears source inductance (~Ls di/dt). For the sake of simplicity, stray inductance Ls is denoted in the Figures as signal source inductance. It should be understood, however, that any stray inductance in the drain-source loop would contribute in the same manner. This Vds reduction becomes more pronounced at higher current slopes, which depends on the MOSFET's input capacitance Ciss, gain k, threshold voltage Vth, gate resistance Rg and applied drive voltage Vgg. Accordingly, weighting factor W includes all relevant parameters contributing to this phenomenon in some embodiments.

Figure 2:
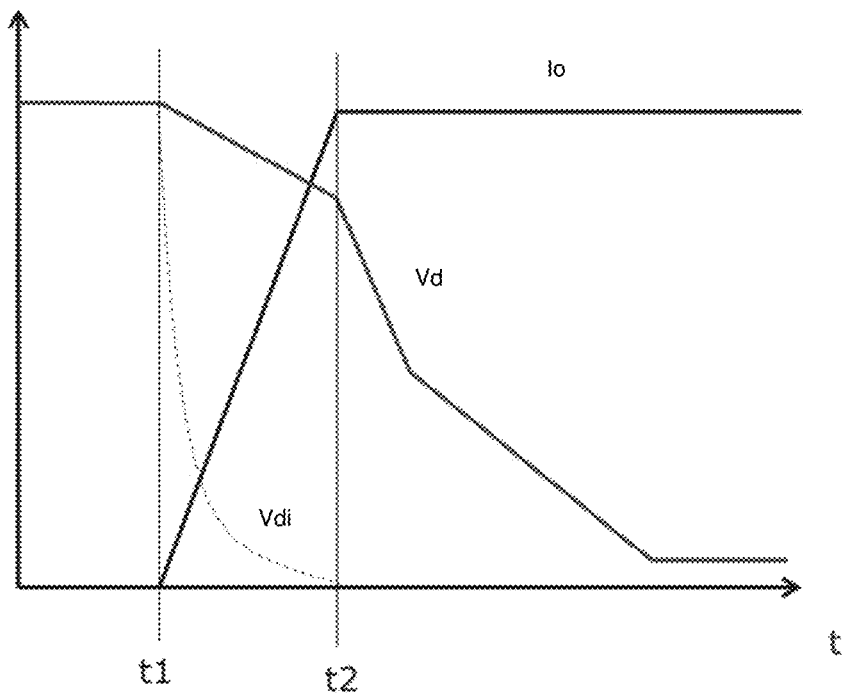
FIG. 2 illustrates a waveform diagram illustrating a time response of an embodiment switching system.

In some embodiments, a Quasi-Zero-Voltage-Switching (QZVS) mode of operation is attained such that the drain-source voltage of the MOSFET Vd reaches a zero and/or minimum value between times t1 and t2 before a full load level of drain current Io is achieved, as shown in FIG. 2, which depicts a waveform diagram of an inductively loaded MOSFET. Curve Io represents the drain current of the MOSFET, curve Vd represents the drain-source voltage of an inductively loaded MOSFET according to a conventional embodiments and curve Vdi represents the drain-source voltage according to an embodiment of the present invention. As is apparent in FIG. 2, embodiment drain-source voltage Vdi curve attains a lower voltage than the conventional embodiment when drain current Io is increasing. As shown, drain-source voltage Vdi is about zero when Io is still increasing. In some embodiments, drain voltage Vdi is reduced with respect to Vd, but is not completely settled when drain current Io stops increasing. For example, in one embodiment, a voltage between the output node and the reference node of the switching transistor decays to at least 30% of an initial voltage value before a current between the output node and the reference node increases to 50% of a final value. Alternatively, other percentages may be used.

To operate the switching transistor in an embodiment QZVS mode all of the parameters mentioned above may be utilized to achieve this mode. However, since the conditions for an embodiment QZVS mode may be different for each load current level Io, parameters that allow a modulation as a function of current may be used. In particular, since Ciss, k and Vth are fixed for the given MOSFET device, and the values of Ls and Rg have a limited universe of values, the variability of the gate drive voltage may be adjusted to implement an embodiment QZVS mode. Thus, based on the expressions derived above, a minimum Vgg per load current may be derived to fulfill a QZVS condition in the whole desired power range:

$$Vgg(Io) \geq Vth + \sqrt{\frac{Io}{k}} + \frac{Vdd \cdot Rg \cdot Ciss}{2 \cdot k \cdot Ls} \cdot \sqrt{\frac{k}{Io}}.$$

Figure 3:
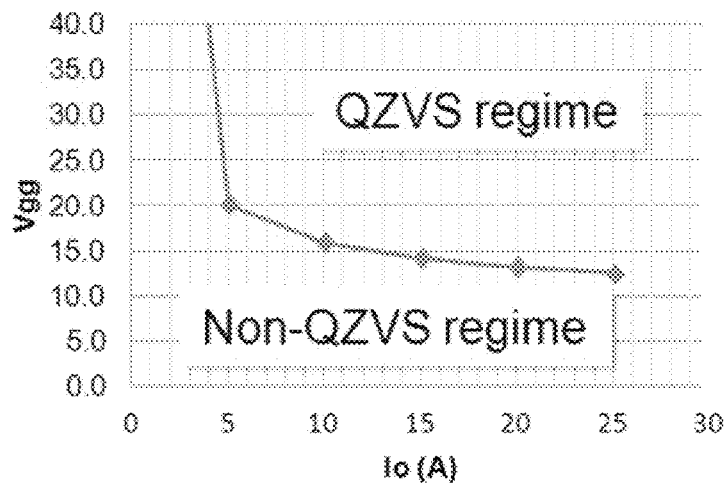
FIG. 3 illustrates a graph of a boundary between a Quasi Zero Voltage Switching (QZVS) regime and a non-QZVS regime.

This means, that for every given current, the gate driver voltage is at least as high or higher than the value indicated by the formula above for the system to operate in a QZVS mode according to embodiments. As an example, FIG. 3 illustrates a graph showing drive voltage Vgg with respect to output current Io that represents a transition from a non-QZVS regime to a QZVS regime for an example MOSFET switching transistor where Vdd=400 V, Vth=3.5 V, Ciss=4.5 nF, Lloop=20 nH, Rg=2 ohms and k=6.5 A/V². As shown, areas under the curve represent the non-QZVS regime and areas over the curve represent the QZVS regime. It should be appreciated that the curve shown in FIG. 3 is just one specific example of many possible embodiment Vgg vs. Io curves. In alternative embodiments, the curve may be different depending on the particular embodiment, its specification and its component parameters.

In an embodiment, driver 106 illustrated in FIG. 1a may be used to implement an embodiment driver that asserts Vgg in accordance with Io curves. Such drivers may be implemented, for example, using circuitry known in the art.

For the implementation in real applications, several further aspects may be taken into account. For example, the modulation depends on the accuracy of the definition of the parameters. In one embodiment, the transfer characteristic k might not follow a perfect quadratic shape. In such embodiments, a curve fit of transfer characteristic k may be performed for different current regions.

Figure 4A:
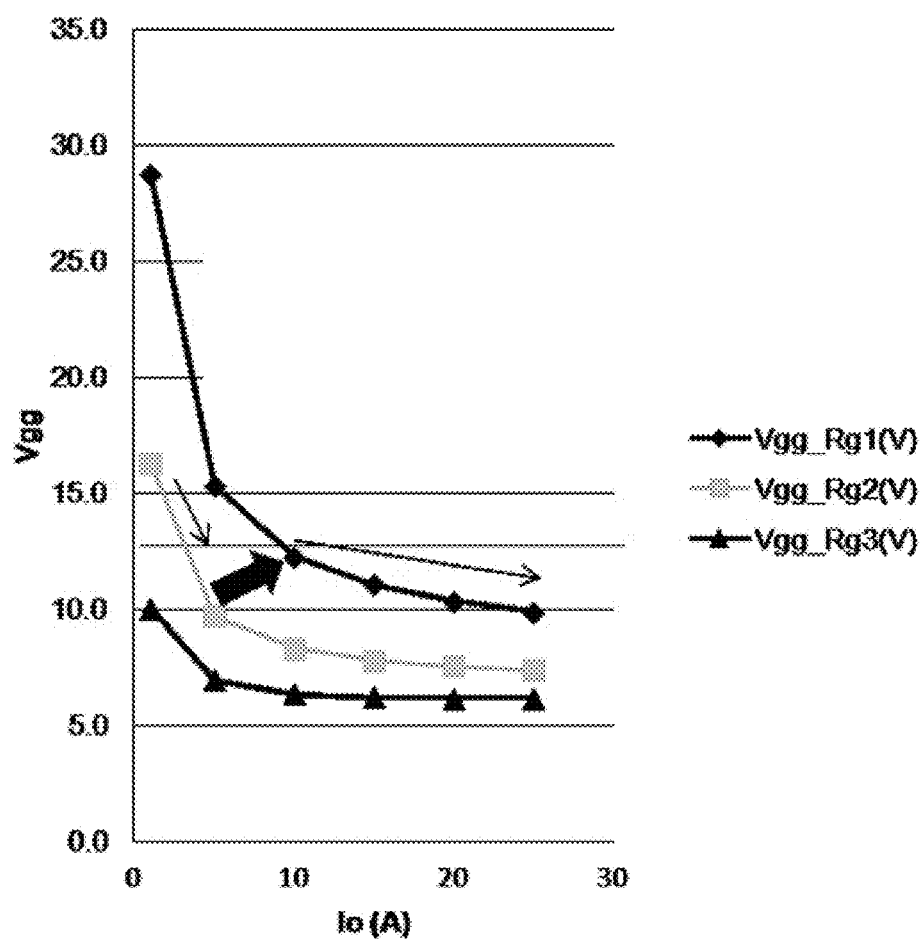
FIG. 4a illustrates a graph showing the effect of gate resistance on the boundary between the QZVS regime and a non-QZVS regime.

In a further embodiment, the drive voltage Vgg to meet QZVS at low currents might be too large for a particular application. In such as case, a second or multiple gate resistor is used to adjust Vgg in order to operate in the QZVS mode of operation. FIG. 4a illustrates a Vgg vs. Io curve over multiple values of gate resistor resistance. As shown, a change in the gate resistance may be used to shift the Vgg vs. Io curve up and down.

Figure 4B:
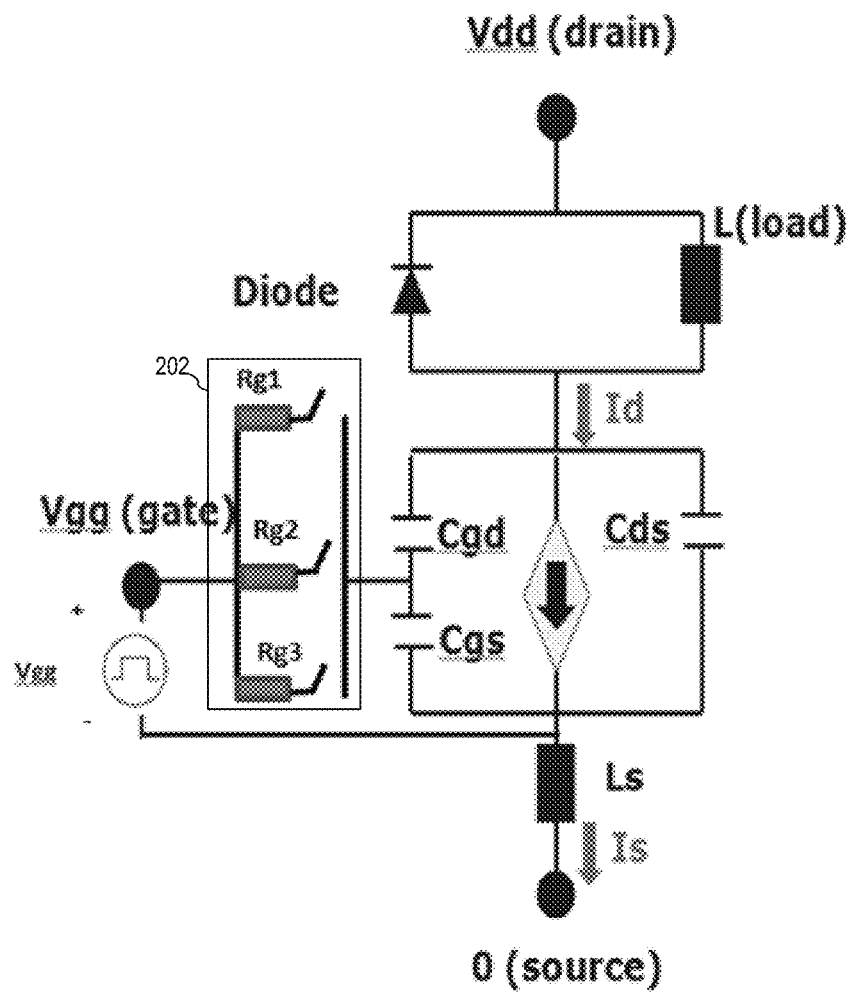
FIG. 4b illustrates an embodiment switching system having an adjustable gate resistor.

FIG. 4b illustrates an embodiment switching transistor configuration that includes a selectable gate resistance 202. As shown selectable gate resistance 202 includes a parallel combination of three switchable resistors Rg1, Rg2 and Rg3. It should be understood that this parallel combination of three resistors Rg1, Rg2 and Rg3 is just one example of many possible ways to implement selectable gate resistance 202. In alternative embodiments, selectable gate resistance may include greater or fewer than three resistors and/or may be implemented using switchable series resistors or a combination of series and parallel switching resistors.

In accordance with an embodiment method, the resistance of selectable gate resistance 202 is selected such that the quasi zero voltage switching regime is achieved and at the same time the gate drive voltage stays between user defined gate driver voltages Vgmax and Vgmin. First, an initial value for the first gate resistor is defined, so that at a low current (e.g. I,10% as 10% of the maximum current in the application I,100%) the driver voltage begins at the maximum allowed voltage (Vg,max). As the current increases, Vgg is reduced as explained previously until the lower gate driver voltage limit (Vg,min) is reached for a certain current I1 that fulfills the following equation:

$$Vg, \min = Vth + \sqrt{\frac{I1}{k}} + \frac{Vdd \cdot Rg1 \cdot Ciss}{2 \cdot k \cdot Ls} \cdot \sqrt{\frac{k}{I1}}.$$

For this I1, a new gate resistor is defined so that the needed Vgg is again Vg,max:

$$Rg2 = \frac{2 \cdot k \cdot Ls}{Vdd \cdot Ciss} \left( Vg, \max - Vth - \sqrt{\frac{I1}{k}} \right) \cdot \sqrt{\frac{I1}{k}}.$$

The same procedure is repeated to find a I2 and its corresponding Rg3, then an I3 and its corresponding Rg4 and so on until one of these currents is higher than the maximum current (I,100%). Once the different resistors are defined, they get implemented in parallel in the driver loop as depicted in FIG. 4b with a switch in series to each one of them, so that one is active for every different current level.

Figure 4C:
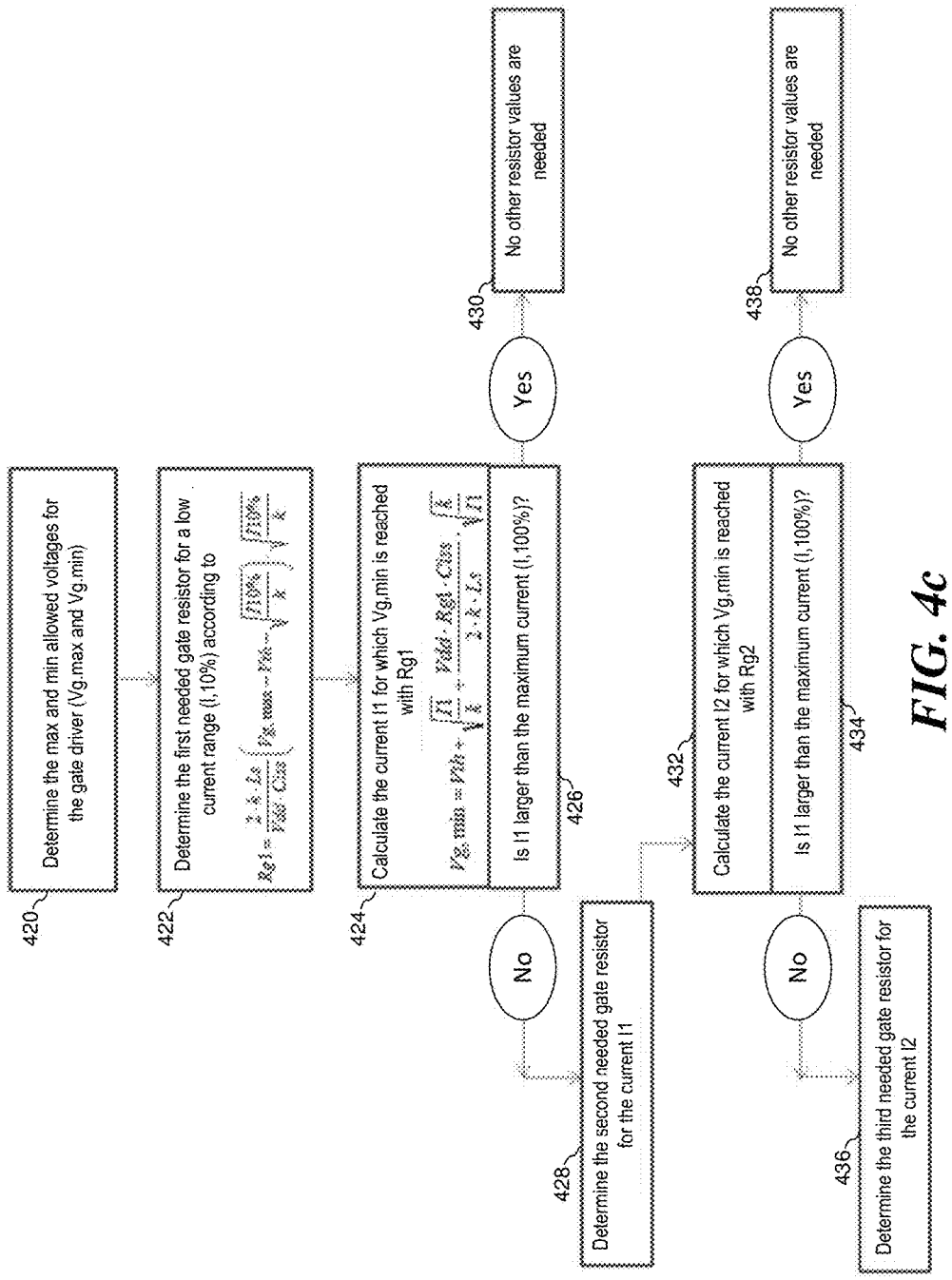
FIG. 4c illustrates an flowchart of an embodiment method of setting the adjustable gate resistor.

FIG. 4c illustrates a flow chart of an embodiment method that implements an embodiment selection process of gate resistors Rg1, Rg2 and Rg3. In step 420, the maximum and minimum voltages Vg.max and Vg.min for the gate driver are determined. In some embodiments, this determination may be a function of the device technology of the gate driver. Next in step 422, the resistance of the first gate resistance Rg1 is determined as follows for a low current range (I,10%):

$$Rg1 = \frac{2 \cdot k \cdot Ls}{Vdd \cdot Ciss} \left( Vg, \max - Vth - \sqrt{\frac{I10\%}{k}} \right) \cdot \sqrt{\frac{I10\%}{k}}.$$

Next, in step 424, current I1 is calculated for which Vg,min is reached with Rg1 such that the following relationship is satisfied:

$$Vg, \min = Vth + \sqrt{\frac{I1}{k}} + \frac{Vdd \cdot Rg1 \cdot Ciss}{2 \cdot k \cdot Ls} \cdot \sqrt{\frac{k}{I1}}.$$

In step 426, a determination is made whether or not I1 is larger than the maximum current (I,100%). If I1 is larger than the maximum current (I,100%), no other resistor value is needed and only the selected value for resistor Rg1 is used (step 430). However, if I1 is not larger than the maximum current (I,100%), a value for second gate resistor Rg2 is determined in step 428. Next, in step 432, the current I2 for which Vg.min is reached with resistor Rg2 is calculated. Again, a determination is made whether or not I1 is larger than maximum current (I,100%) (step 434. If I1 is larger than the maximum current (I,100%), no other resistor value is needed (step 438). If I1 is not larger than the maximum current (I,100%), then the third gate resistor Rg2 is determined for current I2.

Figure 4D:
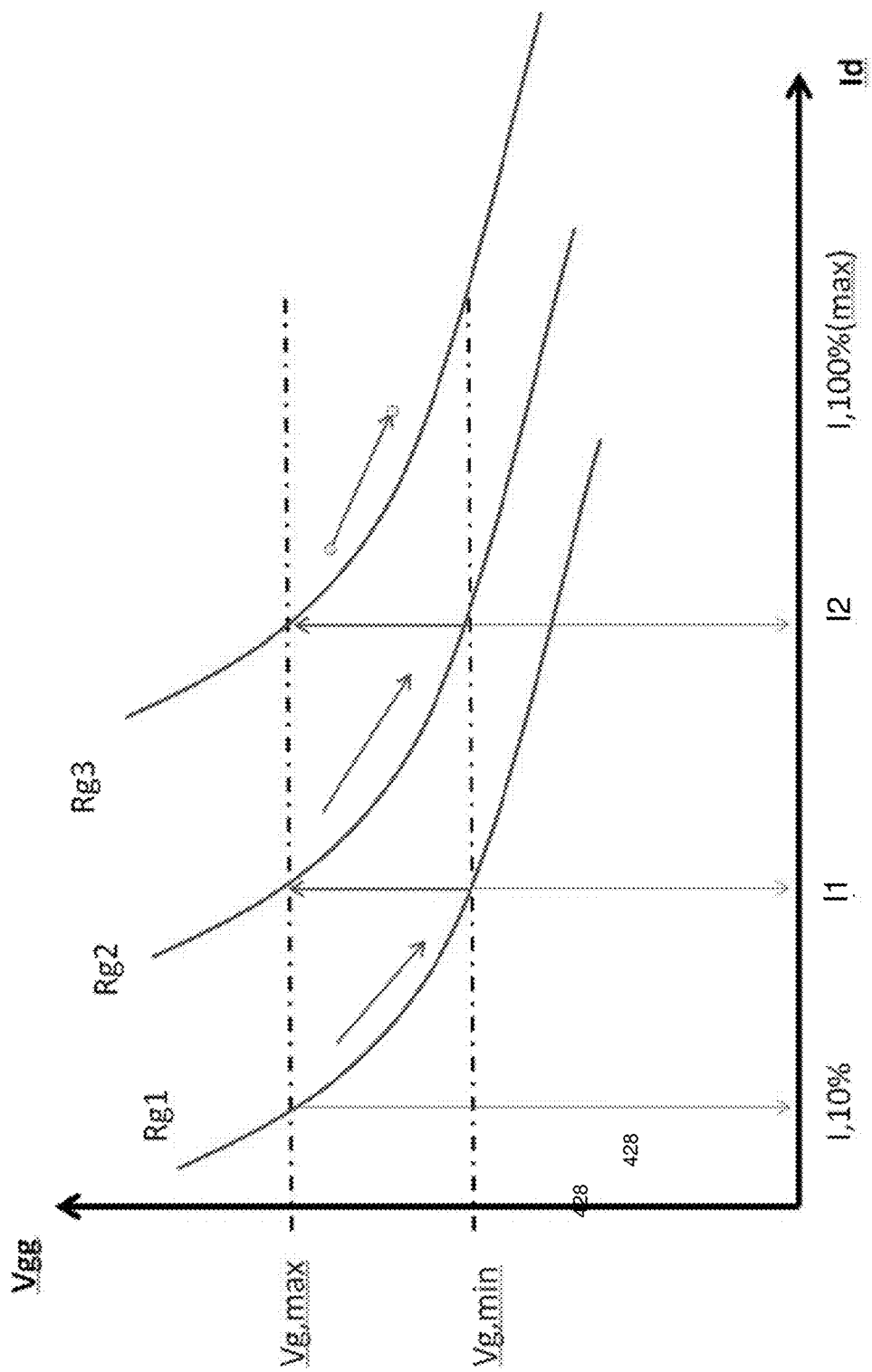
FIG. 4d illustrates and graph showing the effect of the adjustable gate resistor on gate voltage.

FIG. 4d illustrates a graph showing the relationship between Vgg and Id as Rg1, Rg2 and Rg3 is varies. As shown, when current Id is between (I,10%) and I1, resistor Rg1 is activated to keep voltage Vgg between Vg,min and Vg,max. Once current Id exceeds, I1, Rg2 is activated to keep voltage Vgg between Vg,min and Vg,max, and once current Id exceeds, I2, Rg3 is activated to keep voltage Vgg between Vg,min and Vg,max. It should be appreciated that the graph of FIG. 4d is an example of just one of many possible implementations. In alternative embodiments, greater or fewer than three resistors may be used to control gate voltage Vgg.

In various embodiments, power may also be saved when the switching MOSFET is turned-off. For the turn-off transient, a capacitive switching mode of operation for the MOSFET may be used, such that that early channel shutdown may be attained using a freewheeling diode as described below. This mode of operation minimizes switching losses because, ideally, the only energy involved is that of charging the effective output capacitance.

Current equations for a MOSFET that is being turning off is as follows:

$$Id = Coss \frac{dVds}{dt} - Cgd \frac{dVgs}{dt} + k(Vgs - Vth)^2,$$

$$Ig = Ciss \frac{dVgs}{dt} - Cgd \frac{dVds}{dt}, \text{ and}$$

$$0 = Vgs + IgRg.$$

Solving the system of differential equations for the Miller phase (i.e. Vgs=Vm; dVgs/dt=0;), where the voltage ramp-down begins, yields the following two expressions defining the drain voltage steepness:

$$\frac{dVds}{dt} = \frac{Vm}{RgCgd}, \text{ and}$$

$$\frac{dVds}{dt} = \frac{Id - k(Vgs - Vth)^2}{Coss}.$$

By setting the above two equations to be equal, the following "effective Miller Plateau" may be found for this transient:

$$Vm = Vth - \frac{Coss}{2kRgCgd} + \sqrt{\left(\frac{Coss}{2kRgCgd}\right)^2 + \frac{1}{k}\left(Id - \frac{VthCoss}{RgCgd}\right)}.$$

To avoid turn-off losses the system may be configured to have its channel current reduced to zero before drain-source voltage Vds ramps down. Such a condition occurs when the effective Miller voltage is lower than the threshold voltage, and this is fulfilled by the equation above when:

$$Vth\frac{Coss}{Cgd} > RgId.$$

When the above condition is met, an early channel shutdown occurs and the whole load current (in this ideal case Id=Io) is used to charge the output capacitance of the switch. Accordingly, the load current does not flow through the channel at high voltages producing losses.

Furthermore, in the case of a non-ideal freewheeling loop, there is a certain parasitic capacitance in it. Since, in the typical case, the overall capacitance is dominated by that of the non-ideal diode, the capacitance will be referred to as Cdio. This diode internal capacitance has a current Cdio*dVdio/dt flowing through it during this turn-off phase. Since the voltage taken over by the switch is the one lost by the diode (dVdio/dt=−dVds/dt), the steepness of the voltage change and the current through the switch may be expressed as:

$$\frac{dVds}{dt} = \frac{Io}{(Coss + Cdio)}, \text{ and}$$

$$Id = \frac{Coss}{(Coss + Cdio)}Io.$$

From the above equations, two embodiment design guidelines may be derived.

First, because the capacitances of switch and diode are usually not constant but dependent on the drain source voltage value, complementary capacitance profiles may be implemented to keep the dVds/dt below a certain value to avoid eventual ease-of-use issues (e.g. voltage pikes, EMI). Since an embodiment, the maximum relevant current under application conditions (Imax) may be used to determine the sum of Coss+Cdio as follows:

$$Coss + Cdio = \frac{Imax}{\left(\frac{dVds}{dt}\right)max}.$$

Second, the previously described early channel shutdown may be boosted by diode since it reduces the current flowing through the switch and therefore reduces the effective Miller level. Therefore, a condition for early shutdown condition may be derived as. This condition assumed that the maximum relevant current under application conditions is used (Imax), such that at full load:

$$Vth\frac{Coss + Cdio}{Cgd} > RgImax.$$

In an embodiment a set of design guidelines may be applied to a MOSFET, a gate driver, a free-wheeling diode and to package pin out of the MOSFET in order to have an inductively loaded switching transistor operate in a QZVS mode, as well as to have reduced losses when the switching transistor is turned off.

For reduced power consumption when the MOSFET is turned-on, the device dependent parameters of the described weighting factor W may be optimized to make it as high as possible. In particular, the ratio (k/Ciss) may be chosen to be high to allow realistic driver voltages according to the expression below:

$$W = \frac{2kLs}{RgCiss}(Vgg - Vth)^2.$$

In some embodiments, the ratio of Ciss/k which is a ratio of the MOSFET's input capacitance to transconductance to be less than 75 pF V²/A.

A further guideline that is related to the turn-on behavior of the MOSFET is the existence of a Kelvin source contact for the source of the gate driver. For example, in some embodiments, embodiments switching transistors have at least two source package pins: at least one pin to conduct the source current, and at least one reference pin to serve as a reference pin to the gate driver circuit. In embodiments, the reference pin is coupled to the source of the MOSFET but does not share the same inductive path as the pin configured to conduct the source current. In some embodiments, a TO247-4 pin package or a ThinPAK package may be used. Alternatively, other package types may be used that have a separate reference source connection.

In an embodiment, the gate driver is configured to fulfill the following condition for a given gate resistance Rg in order to operate the system in QZVS mode:

$$Vgg(Io) \geq Vth + \sqrt{\frac{Io}{k}} + \frac{Vdd \cdot Rg \cdot Ciss}{2 \cdot k \cdot Ls} \cdot \sqrt{\frac{k}{Io}}.$$

For example, in one embodiment, the gate driver output voltage may be configured to be greater than 13 V for light loaded conditions (20% of the full load), greater than 10 V for medium load conditions (50% of full load) and greater than 8 V for full load conditions. Alternatively, other conditions may be set depending on the particular system, its specifications and it parameters. In an embodiment, driver 106 illustrated in FIG. 1a may be used to implement a gate driver that asserts Vgg in accordance with Io and/or output power. Such drivers may be implemented, for example, using circuitry known in the art.

Regarding turn-off behavior, the MOSFET switching transistor and the diode fulfill the following condition in some embodiments to operate the MOSFET in an early shutdown condition:

$$Vth\frac{Coss + Cdio}{Cgd} > RgImax.$$

In some embodiments, the ratio, (Cdio+Coss)/Cgd that defines a relationship between the freewheeling diode, the output capacitance of the MOSFET and the gate-drain capacitance of the MOSFET is greater than 0.3 for 50 W applications, greater than 3 for 500 W applications and greater than 30 for 5 kW applications. Alternatively, different limits may be used depending on the particular application and its specifications. For example, in some embodiments, a ratio of a total capacitance at an output node of the semiconductor switch to a total capacitance $C_{total}$ at an output node of the semiconductor switch is greater than 0.006 per watt of power being handled by a load coupled to the semiconductor switch. In an embodiment, this total output capacitance Ctotal at the output node of the semiconductor switch using the nomenclature of FIG. 1e, may be expressed as:

$$C_{total} = Cdio(Vdd - Vds) + Coss(Vds)$$
$$= Cdio(Vdd - Vds) + Cdg(Vds) + Cds(Vds),$$

where Cdio is the capacitance of the diode, Coss is the output capacitance of the switching transistor, Cdg is the gate-drain capacitance of switching transistor, and Cds is the drain-source capacitance of the switching transistor. As is shown in the equation, diode capacitance Cdio is a function of a difference between supply voltage Vdd and drain source voltage Vds, while Coss, Cdg and Vds are each functions of drain-source voltage Vds.

Figure 5:
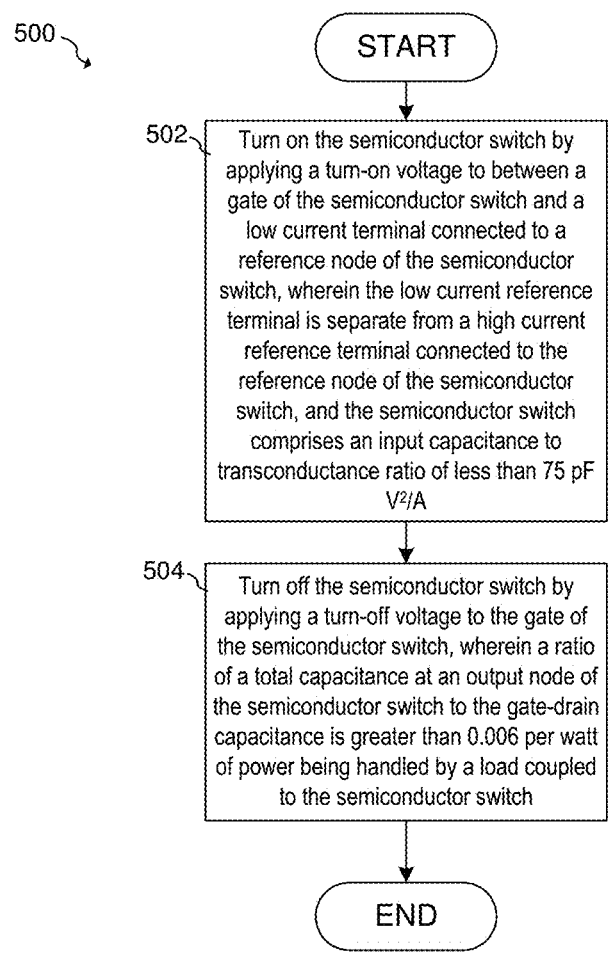
FIG. 5 illustrates a flowchart of an embodiment method.

FIG. 5 illustrates a flowchart of embodiment method 500 of operating a semiconductor switch coupled to an inductor. In step 502, the semiconductor switch is turned-on by applying a turn-on voltage between a gate of the semiconductor switch and a low current terminal connected to a reference node of the semiconductor switch. In some embodiments, this low current terminal is a Kelvin source contact for the source of the gate driver. The low current reference terminal may be separate from a high current reference terminal connected to the reference node of the semiconductor switch.

In an embodiment, the driver delivers a voltage that is greater than 13 V for light loaded conditions (20% of the full load), greater than 10 V for medium load conditions (50% of full load) and greater than 8 V for full load conditions, and the semiconductor switch has an input capacitance to transconductance ratio of less than 75 pF V²/A.

Next, in step 504, the semiconductor switch is turned-off by applying a turn-off voltage to the gate of the semiconductor switch. In an embodiment, a ratio of the sum of the output capacitance of the switch and the effective capacitance of the freewheeling loop (predominantly that of the freewheeling diode) to the gate-drain capacitance of the switch is greater than 0.006 per watt of power being handled by a load coupled to the switching transistor.

Embodiments of the present invention are summarized here. Other embodiments can also be understood from the entirety of the specification and the claims filed herein. One general aspect includes a method of operating a semiconductor switch coupled to an inductor, the method including: turning on the semiconductor switch by applying a turn-on voltage between a gate of the semiconductor switch and a low current terminal connected to a reference node of the semiconductor switch, the low current terminal separate from a high current reference terminal connected to the reference node of the semiconductor switch, and the semiconductor switch includes an input capacitance to transconductance ratio of less than 75 pF V²/A; and turning off the semiconductor switch by applying a turn-off voltage to the gate of the semiconductor switch, where a ratio of a total capacitance at an output node of the semiconductor switch to a gate-drain capacitance is greater than 0.006 per watt of power being handled by a load coupled to the semiconductor switch.

Implementations may include one or more of the following features. The method where the total capacitance at the output node of the semiconductor switch is dominated by a capacitance of a freewheeling diode coupled to the output node of the semiconductor switch. The method may further include: determining a current conducted by the semiconductor switch; and setting the turn-on voltage based on the determined current. In an embodiment, setting the turn-on voltage includes adjusting a gate resistor coupled in series with the gate of the semiconductor switch. The gate resistor may include a plurality of switchable resistors coupled in parallel; and adjusting the gate resistor may include connecting and disconnecting the switchable resistors. In one case, adjusting the gate resistor includes: comparing the determined current with a current threshold; and decreasing a resistance of the gate resistor when the determined current exceeds the current threshold. The current threshold may include a plurality of thresholds, and the gate resistance may be changed each time the determined current crosses each of the plurality of thresholds. The method where the gate resistor is adjusted to keep the turn-on voltage between a predetermined maximum gate voltage and a predetermined minimum gate voltage.

In some embodiments, the turn-on voltage is set to at least 13 V when the current conducted by the semiconductor switch is 20% of a maximum current; the turn-on voltage is set to at least 10 v when the current conducted by the semiconductor switch is 50% of the maximum current; and the turn-on voltage is set to at least 8 V when the current conducted by the semiconductor switch is 100% of the maximum current. The turn-on voltage may be inversely proportional to a square root of a current conducted by the semiconductor switch.

In some embodiments, the turn-on voltage is at least:

$$Vth + \sqrt{\frac{Io}{k}} + \frac{Vdd \cdot Rg \cdot Ciss}{2 \cdot k \cdot Ls} \cdot \sqrt{\frac{k}{Io}},$$

where Vth is a threshold of the semiconductor switch, Io is the current conducted by the semiconductor switch, k is a transconductance of the semiconductor switch, Rg is a gate resistance of the semiconductor switch, Vdd is a supply voltage provided to an inductor coupled to the semiconductor switch, and Ls is a total series inductance of a circuit including the semiconductor switch and an inductor coupled to the semiconductor switch. The method may further include operating a switched mode power supply using the semiconductor switch. In some cases, turning on the semiconductor switch includes turning on a MOSFET.

A further general aspect includes a circuit including: a switching transistor configured to be coupled to an inductor, where the switching transistor is disposed in a package having a sense terminal and a load path terminal connected to a reference node of the switching transistor, the sense terminal is different from the load path terminal of the switching transistor, the switching transistor includes an input capacitance to transconductance ratio of less than 75 pF $V^2/A$, and a ratio of a total capacitance at an output node of the switching transistor to a gate-drain capacitance of the switching transistor is greater than 0.006 per watt of power being handled by a load coupled to the switching transistor; and a driver having an output terminal coupled to a control node of the switching transistor, and a reference terminal coupled to the sense terminal of the switching transistor.

Implementations may include one or more of the following features. The circuit further including a current measurement circuit configured to determine a current flowing between the output node and the load path terminal of the switching transistor. The circuit may further including a control circuit configured to adjust a driving voltage of the driver. The control circuit may be configured to adjust the driving voltage to be inversely proportional to a square root of the determined current flowing between the output node and the load path terminal of the switching transistor. The control circuit may be further configured to: set the driving voltage to at least 13 V when the determined current is 20% of a maximum current; set the driving voltage to at least 10 V when the determined current is 50% of the maximum current; and set the driving voltage to at least 8 V when the determined current is 100% of the maximum current.

The circuit may also include a diode coupled to the output node of the switching transistor. In one case, the voltage between the output node and the reference node of the switching transistor decays to at least 30% of an initial voltage value before a current between the output node and the reference node increases to 50% of a final value.

A further general aspect includes a circuit that includes: a switching transistor disposed in a package including a control terminal connected to a control node of the switching transistor, an output terminal coupled to an output node of the switching transistor, a reference terminal coupled to a reference node of the switching transistor, and a sense terminal coupled to the reference node of the switching transistor; an inductor coupled to the output terminal of the switching transistor; and a diode coupled between the output terminal of the switching transistor, where the following conditions are satisfied $$\frac{Ciss}{k} > 75 \text{ pF } V^2/A,$$

$$Vth \frac{Coss + Cdio}{Cgd} > RgImax,$$

where Ciss is an input capacitance of the switching transistor, k is a transconductance of the switching transistor, Vth is a threshold voltage of the switching transistor, Coss is an output capacitance of the switching transistor, Cgd is an gate-drain capacitance of the switching transistor, Rg is a gate resistance of the switching transistor, Imax is a maximum current of the switching transistor and Cdio is a capacitance of a freewheeling diode loop that includes the inductor and the diode.

Implementations may include one or more of the following features. The circuit further including a driver having an output coupled to the control terminal of the package. The driver may be configured to assert drive voltage Vgg at the output of the driver according to:

$$Vgg \geq Vth + \sqrt{\frac{Io}{k}} + \frac{Vdd \cdot Rg \cdot Ciss}{2 \cdot k \cdot Ls} \cdot \sqrt{\frac{k}{Io}},$$

where Vdd is a supply voltage provided to the inductor, Io is a current of the switching transistor and Ls is a total series inductance of the circuit. In some embodiments, The transconductance k includes a plurality of values depending on the current Io of the switching transistor.

The circuit may also include a current measurement circuit configured to measure the current Io of the switching transistor, where the driver is configured adjust the drive voltage Vgg according to the measured current. A gate resistor may be coupled to the control terminal of the switching transistor, where: the gate resistance has the value Rg; and the circuit is configured to adjust the value Rg of the gate resistance such that Vgg is within quasi-zero-voltage-switching (QZVS) mode of operation. The gate resistor may include a plurality of switchable resistors coupled in parallel; and the circuit may be configured to adjust the value Rg of the gate resistance by connecting and disconnecting the switchable resistors.

The switching transistor may include one of a MOSFET and an IGBT. In an embodiment, the circuit further includes a power supply controller coupled to the control terminal of the switching transistor. In some cases, a voltage between the output node and the reference node of the switching transistor decays to at least 30% of an initial voltage value before a current between the output node and the reference node increases to 50% of a final value.

Advantages of embodiments of the present invention include the ability to save power in hard switching applications by applying a QZVS mode of operation. Further advantages include the ability to control the current range for early channel shutdown and/or capacitive turn-off which may correspond to lowest turn-off losses in some embodiments. A further advantage includes the ability to control a current range with respect to classic non-capacitive turn-off for a slower switching, may be used, for example, in high current critical operation modes.

Another advantage of some embodiments include the ability to control the maximum voltage slope in the early channel shutdown mode such that design criteria including, for example, voltage spikes, EMI and other ease-of-use related features is improved. Another advantageous aspect of some embodiments includes the ability to use a large freewheeling diode to boost the early channel shutdown at turn-off in a manner in which no extra losses are encountered.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method of operating a semiconductor switch coupled to an inductor, the method comprising:
    turning on the semiconductor switch by applying a turn-on voltage between a gate of the semiconductor switch and a first terminal connected to a source node of the semiconductor switch, the first terminal separate from a second terminal connected to the source node of the semiconductor switch via a package inductance coupled between the source node and the second terminal, and the semiconductor switch comprises an input capacitance to transconductance ratio of less than 75 pF $V^2/A$;
    conducting a source current from the source node of the semiconductor switch to the second terminal via the inductance; and turning off the semiconductor switch by applying a turn-off voltage between the gate of the semiconductor switch and the first terminal, wherein a ratio of a total capacitance at an output node of the semiconductor switch to a gate-drain capacitance is greater than 0.006 per watt of power being handled by a load coupled to the semiconductor switch, wherein the turn-on voltage is inversely proportional to a square root of a current conducted by the semiconductor switch.

2. The method of claim 1, wherein the total capacitance at the output node of the semiconductor switch is dominated by a capacitance of a freewheeling diode coupled to the output node of the semiconductor switch.

3. The method of claim 1, further comprising:
determining a current conducted by the semiconductor switch; and
setting the turn-on voltage based on the determined current.

4. The method of claim 3, wherein:
the turn-on voltage is set to at least 13 V when the current conducted by the semiconductor switch is 20% of a maximum current;
the turn-on voltage is set to at least 10 V when the current conducted by the semiconductor switch is 50% of the maximum current; and
the turn-on voltage is set to at least 8 V when the current conducted by the semiconductor switch is 100% of the maximum current.

5. The method of claim 1, wherein the turn-on voltage is at least:

$$Vth + \sqrt{\frac{Io}{k}} + \frac{Vdd \cdot Rg \cdot Ciss}{2 \cdot k \cdot Ls} \cdot \sqrt{\frac{k}{Io}},$$

where Vth is a threshold of the semiconductor switch, Io is the current conducted by the semiconductor switch, k is a transconductance of the semiconductor switch, Rg is a gate resistance of the semiconductor switch, Vdd is a supply voltage provided to the inductor coupled to the semiconductor switch, and Ls is a total series inductance of a circuit including the semiconductor switch and the inductor coupled to the semiconductor switch.

6. The method of claim 1, further comprising operating a switched mode power supply using the semiconductor switch.

7. The method of claim 1, wherein turning on the semiconductor switch comprises turning on a MOSFET.

8. A method of operating a semiconductor switch coupled to an inductor, the method comprising:
turning on the semiconductor switch by applying a turn-on voltage between a gate of the semiconductor switch and a first terminal connected to source node of the semiconductor switch, the first terminal separate from a second terminal connected to the source node of the semiconductor switch via a package inductance coupled between the source node and the second terminal, and the semiconductor switch comprises an input capacitance to transconductance ratio of less than 75 pF V²/A;
conducting a source current from the source node of the semiconductor switch to the second terminal via the inductance;
turning off the semiconductor switch by applying a turn-off voltage between the gate of the semiconductor switch and the first terminal, wherein a ratio of a total capacitance at an output node of the semiconductor switch to a gate-drain capacitance is greater than 0.006 per watt of power being handled by a load coupled to the semiconductor switch;
determining a current conducted by the semiconductor switch; and
setting the turn-on voltage based on the determined current, wherein setting the turn-on voltage comprises adjusting a gate resistor coupled in series with the gate of the semiconductor switch.

9. The method of claim 8, wherein:
the gate resistor comprises a plurality of switchable resistors coupled in parallel; and
adjusting the gate resistor comprises connecting and disconnecting the switchable resistors.

10. The method of claim 8, wherein adjusting the gate resistor comprises:
comparing the determined current with a current threshold; and
decreasing a resistance of the gate resistor when the determined current exceeds the current threshold.

11. The method of claim 10, wherein the current threshold comprises a plurality of thresholds, and a resistance of the gate resistor is changed each time the determined current crosses each of the plurality of thresholds.

12. The method of claim 8, further comprising adjusting the gate resistor to keep the turn-on voltage between a predetermined maximum gate voltage and a predetermined minimum gate voltage.

13. A circuit comprising:
a switching transistor configured to be coupled to an inductor, wherein the switching transistor is disposed in a package having a sense terminal and a load path terminal connected to a reference node of the switching transistor, the sense terminal is different from the load path terminal of the switching transistor, the switching transistor comprises an input capacitance to transconductance ratio of less than 75 pF V²/A, and a ratio of a total capacitance at an output node of the switching transistor to a gate-drain capacitance of the switching transistor is greater than 0.006 per watt of power being handled by a load coupled to the switching transistor;
a driver having an output terminal coupled to a control node of the switching transistor, and a reference terminal coupled to the sense terminal of the switching transistor; and
a current measurement circuit configured to determine a current flowing between the output node and the load path terminal of the switching transistor.

14. The circuit of claim 13, further comprising a control circuit configured to adjust a driving voltage of the driver.

15. The circuit of claim 14, wherein the control circuit is configured to adjust the driving voltage to be inversely proportional to a square root of the determined current flowing between the output node and the load path terminal of the switching transistor.

16. The circuit of claim 14, wherein the control circuit is further configured to:
set the driving voltage to at least 13 V when the determined current is 20% of a maximum current;
set the driving voltage to at least 10 V when the determined current is 50% of the maximum current; and
set the driving voltage to at least 8 V when the determined current is 100% of the maximum current.

17. The circuit of claim 13, further comprising a diode coupled to the output node of the switching transistor.

18. The circuit of claim 13, wherein a voltage between the output node and the reference node of the switching transistor decays to at least 30% of an initial voltage value before a current between the output node and the reference node increases to 50% of a final value.

19. The circuit of claim 13, further comprising the inductor.

20. A circuit comprising:
a switching transistor disposed in a package comprising a control terminal connected to a control node of the switching transistor, an output terminal coupled to an output node of the switching transistor, a reference terminal coupled to a reference node of the switching transistor, and a sense terminal coupled to the reference node of the switching transistor;
an inductor coupled to the output terminal of the switching transistor; and
a diode coupled to the output terminal of the switching transistor, wherein the following conditions are satisfied $$\frac{Ciss}{k} > 75 \text{ pF V}^2/\text{A},$$

$$Vth \frac{Coss + Cdio}{Cgd} > RgImax,$$

where Ciss is an input capacitance of the switching transistor, k is a transconductance of the switching transistor, Vth is a threshold voltage of the switching transistor, Coss is an output capacitance of the switching transistor, Cgd is an gate-drain capacitance of the switching transistor, Rg is a gate resistance of the switching transistor, Imax is a maximum current of the switching transistor and Cdio is a capacitance of a freewheeling diode loop that includes the inductor and the diode; and
a driver having an output coupled to the control terminal of the package, wherein the driver is configured to assert drive voltage Vgg at the output of the driver according to $$Vgg \geq Vth + \sqrt{\frac{Io}{k}} + \frac{Vdd \cdot Rg \cdot Ciss}{2 \cdot k \cdot Ls} \cdot \sqrt{\frac{k}{Io}},$$

where Vdd is a supply voltage provided to the inductor, Io is a current of the switching transistor and Ls is a total series inductance of the circuit.

21. The circuit of claim 20, wherein the transconductance k comprises a plurality of values depending on the current Io of the switching transistor.

22. The circuit of claim 20, further comprising a current measurement circuit configured to measure the current Io of the switching transistor, wherein the driver is configured adjust the drive voltage Vgg according to the measured current.

23. The circuit of claim 22, further comprising a gate resistor coupled to the control terminal of the switching transistor, wherein:
the gate resistance has the value Rg; and
the circuit is configured to adjust the value Rg of the gate resistance such that Vgg is within Quasi-Zero-Voltage-Switching (QZVS) mode of operation.

24. The circuit of claim 23, wherein:
the gate resistor comprises a plurality of switchable resistors coupled in parallel; and
the circuit is configured to adjust the value Rg of the gate resistance by connecting and disconnecting the switchable resistors.

25. The circuit of claim 20, wherein the switching transistor comprises one of a MOSFET and an IGBT.

26. The circuit of claim 20 further comprises a power supply controller coupled to the control terminal of the switching transistor.

27. The circuit of claim 20, wherein a voltage between the output node and the reference node of the switching transistor decays to at least 30% of an initial voltage value before a current between the output node and the reference node increases to 50% of a final value.

* * * * *